United States Patent
Chen et al.

(10) Patent No.: US 9,196,586 B2
(45) Date of Patent: Nov. 24, 2015

(54) SEMICONDUCTOR PACKAGE INCLUDING AN EMBEDDED SURFACE MOUNT DEVICE AND METHOD OF FORMING THE SAME

(71) Applicant: Taiwan Semiconductor Manufacturing Company, Ltd., Hsin-Chu (TW)

(72) Inventors: Hsien-Wei Chen, Hsin-Chu (TW); Ying-Ju Chen, Tuku Township (TW); Ming-Yen Chiu, Zhubei (TW); Der-Chyang Yeh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/180,084

(22) Filed: Feb. 13, 2014

(65) Prior Publication Data

US 2015/0228580 A1   Aug. 13, 2015

(51) Int. Cl.
*H01L 23/02* (2006.01)
*H01L 23/538* (2006.01)
*H01L 23/12* (2006.01)
*H01L 23/31* (2006.01)
*H01L 23/00* (2006.01)

(52) U.S. Cl.
CPC .............. *H01L 23/538* (2013.01); *H01L 23/12* (2013.01); *H01L 23/3107* (2013.01); *H01L 24/17* (2013.01); *H01L 24/81* (2013.01); *H01L 2924/15153* (2013.01)

(58) Field of Classification Search
USPC .......... 257/685, 686, 723, 724, 777, E25.006, 257/E25.013, E25.021, E25.027, E23.085
See application file for complete search history.

(56) References Cited

U.S. PATENT DOCUMENTS

| | | | |
|---|---|---|---|
| 2001/0010398 A1 | 8/2001 | Farooq et al. | |
| 2004/0022038 A1* | 2/2004 | Figueroa et al. | 361/763 |
| 2007/0085200 A1* | 4/2007 | Lu et al. | 257/724 |
| 2010/0025844 A1 | 2/2010 | Yamazaki | |

* cited by examiner

*Primary Examiner* — Jasmine Clark
(74) *Attorney, Agent, or Firm* — Slater & Matsil, L.L.P.

(57) ABSTRACT

Embodiments of the present disclosure include semiconductor packages and methods of forming the same. An embodiment is a semiconductor package including a first package including one or more dies, and a package substrate bonded to a first side of the first package with by a first set of connectors. The semiconductor package further includes a surface mount device mounted to the first side of the first package, the surface mount device consisting essentially of one or more passive devices.

20 Claims, 3 Drawing Sheets

SEMICONDUCTOR PACKAGE INCLUDING AN EMBEDDED SURFACE MOUNT DEVICE AND METHOD OF FORMING THE SAME

CROSS-REFERENCE TO RELATED APPLICATION

This application is related to commonly owned and co-pending patent application Ser. No. 14/180,138, filed on Feb. 13, 2014 and entitled "Semiconductor Device including an Embedded Surface Mount Device and Method of Forming the Same," which application is incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrink the process node towards the sub-20 nm node). As the demand for miniaturization, higher speed and greater bandwidth, as well as lower power consumption and latency has grown recently, there has grown a need for smaller and more creative packaging techniques of semiconductor dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
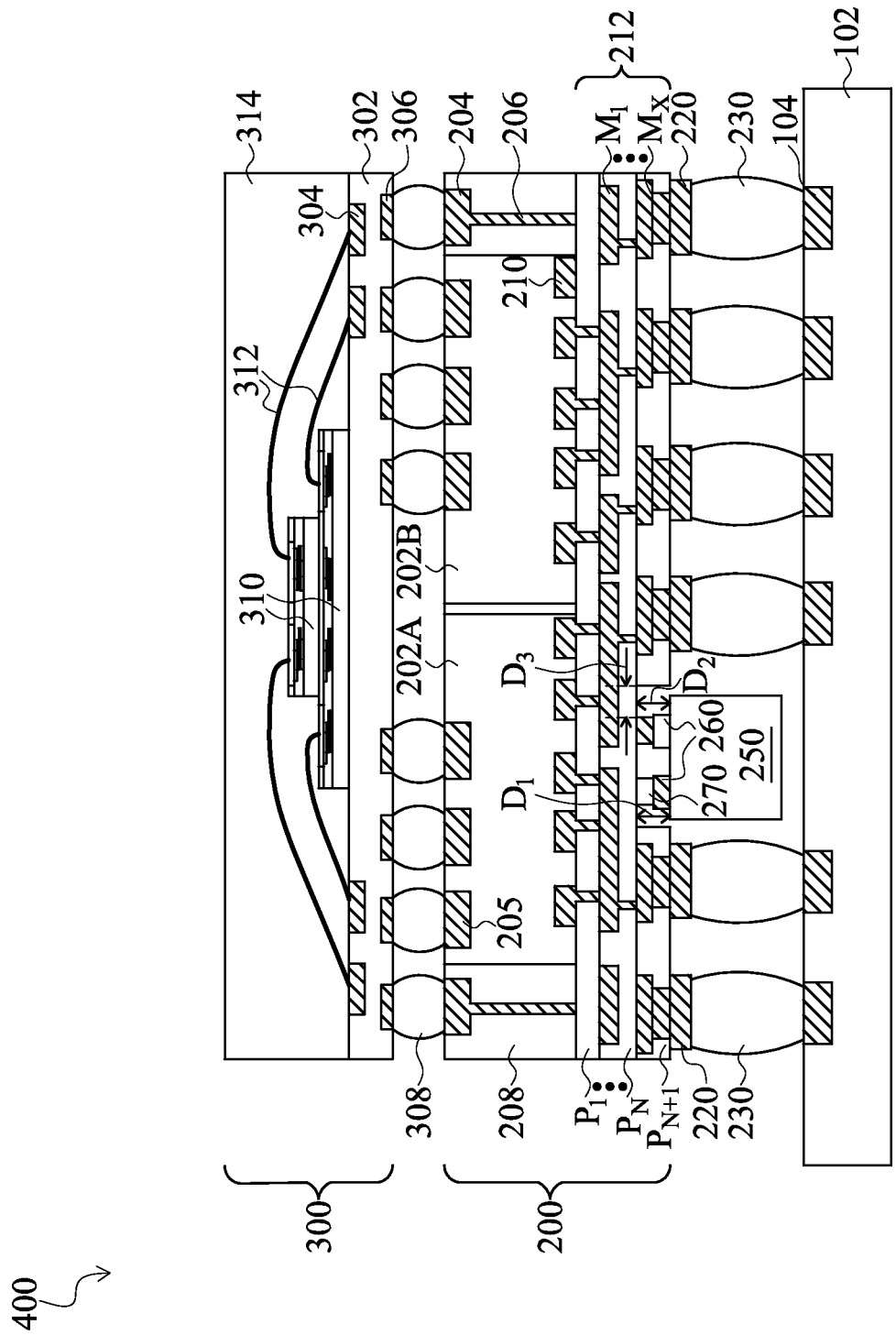
FIG. 1 illustrates a semiconductor package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely making and using semiconductor packages including surface mount devices. Other embodiments may also be applied, however, to other electrically connected components, including, but not limited to, package-on-package assemblies, die-to-die assemblies, wafer-to-wafer assemblies, die-to-substrate assemblies, in assembling packaging, in processing substrates, interposers, substrates, or the like, or mounting input components, boards, dies or other components, or for connection packaging or mounting combinations of any type of integrated circuit or electrical component.

FIG. 1 illustrates a semiconductor package 400 in accordance with some embodiments. The semiconductor package 400 includes a substrate 102, a first package 200 over the substrate 102, and a second package 300 over the first package 200.

The substrate 102 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 102 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 102 is, in one alternative embodiment, based on an insulating core such as a fiberglass reinforced resin core. One example core material is fiberglass resin such as FR4. Alternatives for the core material include bismaleimide-triazine (BT) resin, or alternatively, other PC board materials or films. Build up films such as Ajinomoto build-up film (ABF) or other laminates may be used for substrate 102. The substrate 102 may be referred to as a package substrate 102.

The substrate 102 may include active and passive devices (not shown in FIG. 1). As one of ordinary skill in the art will recognize, a wide variety of devices such as transistors, capacitors, resistors, combinations of these, and the like may be used to generate the structural and functional requirements of the design for the semiconductor package 400. The devices may be formed using any suitable methods The substrate 102 may also include metallization layers (not shown). The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 102 is substantially free of active and passive devices.

The substrate 102 includes bond pads 104. The bond pads 104 may be formed in a first side of the substrate 102. In some embodiments, the bond pads 104 are formed by forming recesses (not shown) into the substrate 102 or a passivation layer (not shown) on the substrate 102. The recesses may be formed to allow the bond pads 104 to be embedded into the substrate 102 or the passivation layer. In other embodiments, the recesses are omitted as the bond pads 104 may be formed on a first side of the substrate 102. The bond pads 104 electrically and/or physically couple the subsequently bonded first and/or second packages 200 and 300 to the active and passive devices (if present) of substrate 102, and/or the connectors (not shown) on a second side of the substrate 102. In some embodiments, the bond pads 104 include a thin seed layer (not shown) deposited on the substrate 102, such as by physical vapor deposition (PVD), chemical vapor deposition (CVD), atomic layer deposition (ALD), the like, or a combination thereof. The seed layer may be made of copper, titanium, nickel, gold, the like, or a combination thereof. The conductive material of the bond pads 104 may be deposited over the thin seed layer. The conductive material may be formed by an electro-chemical plating process, CVD, ALD, PVD, the like, or a combination thereof. In an embodiment, the conductive material of the bond pads 104 is copper, tungsten, aluminum, silver, gold, the like, or a combination thereof.

In an embodiment, the bond pads include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the bond pads 104. Any suitable materials or layers of material that may be used for the bond pads 104 are fully intended to be included within the scope of the current application.

The first package 200 includes one or more dies 202 (202A and 202B) encapsulated in a molding material 208. The die(s) 202 are coupled to a set of bond pads 205 on a first side and have a set of contact areas 210 on a second side, the second side being opposite the first side. A set of electrical connectors 206 extend from bond pads 204 through the molding material 208 adjacent the die(s) 202. The electrical connectors 206 extend from the first side of the die(s) 202 to the second side of the die(s) 202. An interconnect structure 212 is formed over the second side of the die(s) 202 and the electrical connectors 206. The interconnect structure 212 includes alternating passivation layers ($P_1$, $P_N$, and $P_{N+1}$) and metallization layers ($M_1$ and $M_X$) with the metallization layers being connected by vias extending through the passivation layers. A surface mount device 250 is directly coupled to the metallization layer $M_X$.

In an embodiment, the first package 200 is formed by forming bond pads 204 and 205 over a carrier substrate (not shown). The bond pads 204 and 205 may be formed of similar materials and by similar processes as the bond pads 104 described above and the description is not repeated herein, although the bond pads 204 and 205 and the bond pads 104 need not be the same.

The electrical connectors 206 may be stud bumps, which are formed by wire bonding on the bond pads 204, and cutting the bond wire with a portion of bond wire left attached to the respective bond ball. For example, in FIG. 1, the electrical connectors 206 include a lower portion and an upper portion, wherein the lower portion may be a bond ball formed in the wire bonding, and the upper portion may be the remaining bond wire. The upper portion of the electrical connector 206 may have a uniform width and a uniform shape that are uniform throughout the top part, the middle part, and the bottom part of upper portion. The electrical connectors 206 are formed of non-solder metallic materials that can be bonded by a wire bonder. In some embodiments, the electrical connectors 206 are made of copper wire, gold wire, the like, or a combination thereof, and may have a composite structure including a plurality of layers.

In alternative embodiments, the electrical connectors 206 are formed through electrical plating. In these embodiments, the electrical connectors 206 are made of copper, aluminum, nickel, gold, silver, palladium, the like, or a combination thereof, and may have a composite structure including a plurality of layers. In these embodiments, a sacrificial layer (not shown) is formed over the carrier substrate. A plurality of openings is formed in the sacrificial layer to expose the underlying bond pads 204. A plating step is then performed to plate the electrical connectors 206. After the formation of the electrical connectors 206, the sacrificial layer is then removed.

After the bond pads 205 are formed, the first side of the die(s) 202 may be coupled to the bond pads 205. The die(s) 202 (202A and 202B) may be a single die or may be more than two dies. The dies(s) 202 may include a logic die, such as a central processing unit (CPU), a graphics processing unit (GPU), the like, or a combination thereof. In some embodiments, the die(s) 202 includes a die stack (not shown) which may include both logic dies and memory dies. The die(s) 202 may include an input/output (I/O) die, such as a wide I/O die that provides a connection between the first package 200 and the subsequently attached second package 300.

The contact areas 210 on the second side of the die(s) 202 may be similar to the bond pads 104 described above and the description is not repeated herein, although the contact areas 210 and the bond pads 104 need not be the same.

The die(s) 202 and the electrical connectors 206 may then be encapsulated. In some embodiments, the die(s) 202 and the electrical connectors 206 are encapsulated by a molding material 208. The molding material 208 may be molded on the die(s) 202 and the electrical connectors 206, for example, using compression molding. In some embodiments, the molding material 208 is made of a molding compound, a polymer, an epoxy, silicon oxide filler material, the like, or a combination thereof. A curing step may be performed to cure the molding material 208, wherein the curing may be a thermal curing, a Ultra-Violet (UV) curing, or the like.

In some embodiments, the die(s) 202, the contact areas 210, and the electrical connectors 206 are buried in the molding material 208, and after the curing of the molding material 208, a planarization step, such as a grinding, is performed to remove excess portions of the molding material 208, which excess portions are over top surfaces of the contact areas 210 and the electrical connectors 206. In some embodiments, surfaces of the contact areas 210 and surfaces of the electrical connectors 206 are exposed, and are level with a surface of the molding material 208. The electrical connectors 206 may be referred to as through molding vias (TMVs) and will be referred to as TMVs 206 hereinafter.

The interconnect structure 212 may be formed over and electrically coupled to the contact areas 210 of the die(s) 202 and the TMVs 206. The interconnect structure includes more than one passivation layer, namely $P_1$, $P_N$, and $P_{N+1}$, wherein the passivation layer $P_1$ is the passivation layer immediately adjacent the contact areas 210 and the TMVs 206, and the passivation layer $P_{N+1}$ (sometimes referred to as the top passivation layer $P_{N+1}$) is the passivation layer immediately adjacent under bump metallizations (UBMs) 220. The interconnect structure 212 further includes more than one metal layer, namely $M_1$ and $M_X$, wherein the metal layer $M_1$ is the metal layer immediately adjacent the passivation layer $P_1$, and metal layer $M_X$ (sometimes referred to as the top metal layer $M_X$) is the metal layer immediately adjacent the UBMs 220. Throughout the description, the term "metal layer" refers to the collection of the metal lines in the same layer.

The passivation layers ($P_1$, $P_N$, and $P_{N+1}$) can be silicon nitride, silicon carbide, silicon oxide, low-k dielectrics such as carbon doped oxides, extremely low-k dielectrics such as porous carbon doped silicon dioxide, a polymer, such as an epoxy, polyimide, benzocyclobutene (BCB), polybenzoxazole (PBO), the like, or a combination thereof, although other relatively soft, often organic, dielectric materials can also be used, and deposited by CVD, PVD, ALD, a spin-on-dielectric process, the like, or a combination thereof. In an embodiment, each passivation layer ($P_1$, $P_N$, and $P_{N+1}$) is formed to a thickness from about 2 μm to about 15 μm.

The metal layers, $M_1$ and $M_X$, may be formed using a single and/or a dual damascene process, a via-first process, or a metal-first process. The metal layers ($M_1$ and $M_X$) and vias may be formed of a conductive material, such as copper, aluminum, titanium, the like, or a combination thereof, with or without a barrier layer. In an embodiment, each of the metal layers $M_1$ through $M_X$ have a thickness in a range from about 1 μm to about 12 μm.

A damascene process is the formation of a patterned layer embedded in another layer such that the top surfaces of the two layers are coplanar. A damascene process, which creates either only trenches or vias, is known as a single damascene process. A damascene process, which creates both trenches and vias at once, is known as a dual damascene process.

In an exemplary embodiment, the metal layers $M_1$ through $M_X$ are formed using a dual damascene process. In this example, the formation of the $M_1$ layer may begin with the formation of an etch stop layer (not shown) on the passivation layer $P_1$ and with passivation layer $P_N$ on the etch stop layer. Once the passivation layer $P_N$ is deposited, portions of the passivation layer $P_N$ may be etched away to form recessed features, such as trenches and vias, which can be filled with conductive material to connect different regions of the interconnect structure 212 and accommodate the metal lines and vias. This process may be repeated for the remaining metal layers through $M_X$.

The number of metal layers $M_1$ to $M_X$ and the number of passivation layers $P_1$ through $P_{N+1}$ are only for illustrative purposes and are not limiting. There could be other number of layers that is more or less than the two metal layers illustrated. There may be other number of passivation layers, and other number of metal layers different from those illustrated in FIG. 1.

The UBMs 220 may be formed over and electrically coupled to the metal layer $M_X$. A set of openings (not shown) may be formed through the passivation layer $P_{N+1}$ to expose surfaces of the metal lines in the metal layer $M_X$. The UBMs 220 may extend through these openings in the passivation layer $P_{N+1}$ and also extend along a surface of passivation layer $P_{N+1}$. The UBMs 220 may include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 220. Any suitable materials or layers of material that may be used for the UBMs 220 are fully intended to be included within the scope of the current application.

The surface mount device 250 is mounted directly to one or more of the metal lines 270 of the top metal layer $M_X$ via conductive connectors 260. The portion of the top passivation layer $P_{N+1}$ covering the metal lines 270 may be removed by a suitable process, such as an etching process, a laser, the like, or a combination thereof. The recess formed by removing the portion of the top passivation layer $P_{N+1}$ has a depth of a distance $D_1$. In an embodiment, the distance $D_1$ is from about 10 μm to about 30 μm.

In an embodiment, the surface mount device 250 has two contacts, which are electrically coupled to the interconnect structure 212 through the conductive connectors 260 and the metal lines 270. In some embodiments, the conductive connectors 260 are formed to have height as measured orthogonally from a surface of the surface mount device 250 to a surface of the conductive connectors 260 from about 10 μm to about 30 μm.

The surface mount device 250 may include one or more passive components such as a capacitor, a resistor, an inductor, the like, or a combination thereof. In an embodiment, the surface mount device 250 consists essentially of one or more passive devices and does not include an active device such as a transistor. As shown in FIG. 1, the surface mount device 250 may include two conductive connectors 260 formed of conductive materials such as solder, the like, or a combination thereof. In some embodiments, the surface mount device 250 has a length from about 0.4 mm to about 1.5 mm, a width from about 0.1 mm to about 0.8 mm, and a thickness from about 0.1 mm to about 0.2 mm.

The conductive connectors 260 may be formed by a metal-paste printing process that is applied to the metal lines 270. According to the locations of the metal lines 270, a stencil may be employed to print the metal paste on top of the metal lines 270. A reflow process is applied to the semiconductor package so that the metal paste may coalesce into conductive connectors 260 on top of the metal lines 270 of the interconnect structure 212.

Alternatively, the conductive connectors 260 may be formed by disposing a photo resist (not shown) over the interconnect structure 212, patterning the photo resist to form a plurality of openings over the metal lines 270 of the interconnect structure 212, filling the openings with suitable materials such as solder and the like, reflowing the solder materials, and removing the photo resist to expose the conductive connectors 260

In some embodiments, the conductive connectors 260 are formed on the surface mount device 250 rather than being formed on the interconnect structure 212.

After the conductive connectors 260 are formed, the surface mount device 250 may be placed in the recess of the interconnect structure 212 by, for example, a pick and place tool. In an embodiment, the surface mount device 250 is bonded to the interconnect structure 212 by a reflow process. During this reflow process, the metal lines 270 of the interconnect structure 212 are in contact with the conductive connectors 260 to physically and electrically couple the surface mount device 250 to the interconnect structure 212.

With the surface mount device 250 mounted to the metal lines 270, the surface of the surface mount device 250 nearest the passivation layer $P_N$ is separated from the passivation layer $P_N$ by a distance $D_2$, which, in an embodiment, is from about 10 μm to about 30 μm. The sidewalls of the metal lines 270 and the conductive connectors 260 are separated from the sidewalls of the top passivation layer $P_{N+1}$ by a distance $D_3$, which, in an embodiment, is greater than 10 µm.

After the surface mount device 250 is mounted to the metal lines 270, the first package 200 is bonded to the substrate 102 by way of conductive connectors 230, the UBMs 220, and the bond pads 104. Before the first package 200 is bonded to the substrate 102, the first package 200 may be singulated (if necessary) and the carrier substrate (not shown) may be removed.

The conductive connectors 230 may be a solder ball, a metal pillar, a controlled collapse chip connection (C4) bump, a micro bump, an electroless nickel-electroless palladium-immersion gold technique (ENEPIG) formed bump, or the like. The conductive connectors 230 may include a conductive material such as solder, copper, aluminum, gold, nickel, silver, palladium, tin, the like, or a combination thereof. In an embodiment in which the conductive connectors 230 are solder bumps, the conductive connectors 230 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 230 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 230. The metal cap layer may include nickel, tin, tin-lead, gold, silver, palladium, indium, nickel-palladium-gold, nickel-gold, the like, or a combination thereof and may be formed by a plating process.

The bonding between the first package 200 and the substrate 102 may be a solder bonding or a direct metal-to-metal (such as a copper-to-copper or tin-to-tin) bonding. In an embodiment, the first package 200 is bonded to the substrate 102 by a reflow process. During this reflow process, the conductive connectors 230 are in contact with the bond pads 104 and the UBMs 220 to physically and electrically couple the first package 200 to the substrate 102.

The second package 300 may be formed and bonded to the first package 200 before or after the first package 200 is bonded to the substrate 102. The second package 300 includes a substrate 302 and one or more stacked dies 310 coupled to the substrate 302.

The substrate 302 may have bond pads 304 on a first side the substrate 302 to couple to the stacked dies 310, and bond pads 306 on a second side of the substrate 302, the second side being opposite the first side of the substrate 302, to couple to the conductive connectors 308. The substrate 302 may be similar to substrate 102 described above and the description is not repeated herein, although the substrates 302 and 102 need not be the same. The substrate 302 may include electronic components and elements formed thereon in some embodiments, or alternatively, the substrate 302 may be free of electronic components and elements.

In the illustrated embodiment, the stacked dies 310 are coupled to the substrate 302 by wire bonds 312, although other connections may be used, such as conductive bumps. In an embodiment, the stacked dies 310 are stacked memory dies. For example, the stacked memory dies 310 may include low-power (LP) double data rate (DDR) memory modules, such as LPDDR1, LPDDR2, LPDDR3, or the like memory modules. The stacked memory dies 310 may be coupled to the first package 200 through the wire bonds 312, the bond pads 304 and 306, and the conductive connectors 308.

In some embodiments, the stacked dies 310 and the wire bonds 312 may be encapsulated by a molding material 314. The molding material 314 may be molded on the stacked dies 310 and the wire bonds 312, for example, using compression molding. In some embodiments, the molding material 314 is a molding compound, a polymer, an epoxy, silicon oxide filler material, the like, or a combination thereof. A curing step may be performed to cure the molding material 314, wherein the curing may be a thermal curing, a UV curing, or the like.

In some embodiments, the stacked dies 310 and the wire bonds 312 are buried in the molding material 314, and after the curing of the molding material 314, a planarization step, such as a grinding, is performed to remove excess portions of the molding material 314 and provide a substantially planar surface for the second package 300.

After the second package 300 is formed, the second package 300 is bonded to first package 200 by way of conductive connectors 308 and the bond pads 306 and 204.

The conductive connectors 308 may be similar to the conductive connectors 230 described above and the description is not repeated herein, although the conductive connectors 308 and 230 need not be the same.

The bonding between the second package 300 and the first package 200 may be a solder bonding or a direct metal-to-metal (such as a copper-to-copper or tin-to-tin) bonding. In an embodiment, the second package 300 is bonded to the first package 200 by a reflow process. During this reflow process, the conductive connectors 308 are in contact with the bond pads 306 and 204 to physically and electrically couple the second package 300 to the first package 200.

An underfill material (not shown) may be injected or otherwise formed in the space between the first package 200 and the second package 300 and surrounding the conductive connectors 308. Further, an underfill material (not shown) may be injected or otherwise formed in the space between the first package 200 and the substrate 102 and surrounding the surface mount device 250 and the conductive connectors 230. The underfill material may, for example, be a liquid epoxy, deformable gel, silicon rubber, or the like, that is dispensed between the structures, and then cured to harden. This underfill material is used, among other things, to reduce damage to and to protect the surface mount device 250 and the conductive connectors 230 and 308.

It should be noted that the number of semiconductor dies (e.g., semiconductor die(s) 202), surface-mount devices (e.g., surface mount device 250), and conductive connectors (e.g. conductive connectors 230 and 308) shown in FIG. 1 are merely an example. There may be many variations, modifications, and alternatives. For example, a person skilled in the art will recognize that the semiconductor package 400 may accommodate any number of semiconductor dies, surface-mount devices, and conductive connectors.

By having the surface mount device embedded between the package and the package substrate, the form factor of the semiconductor package can be lowered as compared to a package where the surface mount device is mounted on the package substrate adjacent the package or somewhere else on the semiconductor package. In addition, the signal integrity for the surface mount device will be improved, as there is no need of a long metal conductor, such as a redistribution line or interconnect, to couple the interconnect and/or dies to the surface mount device.

Figure 2:
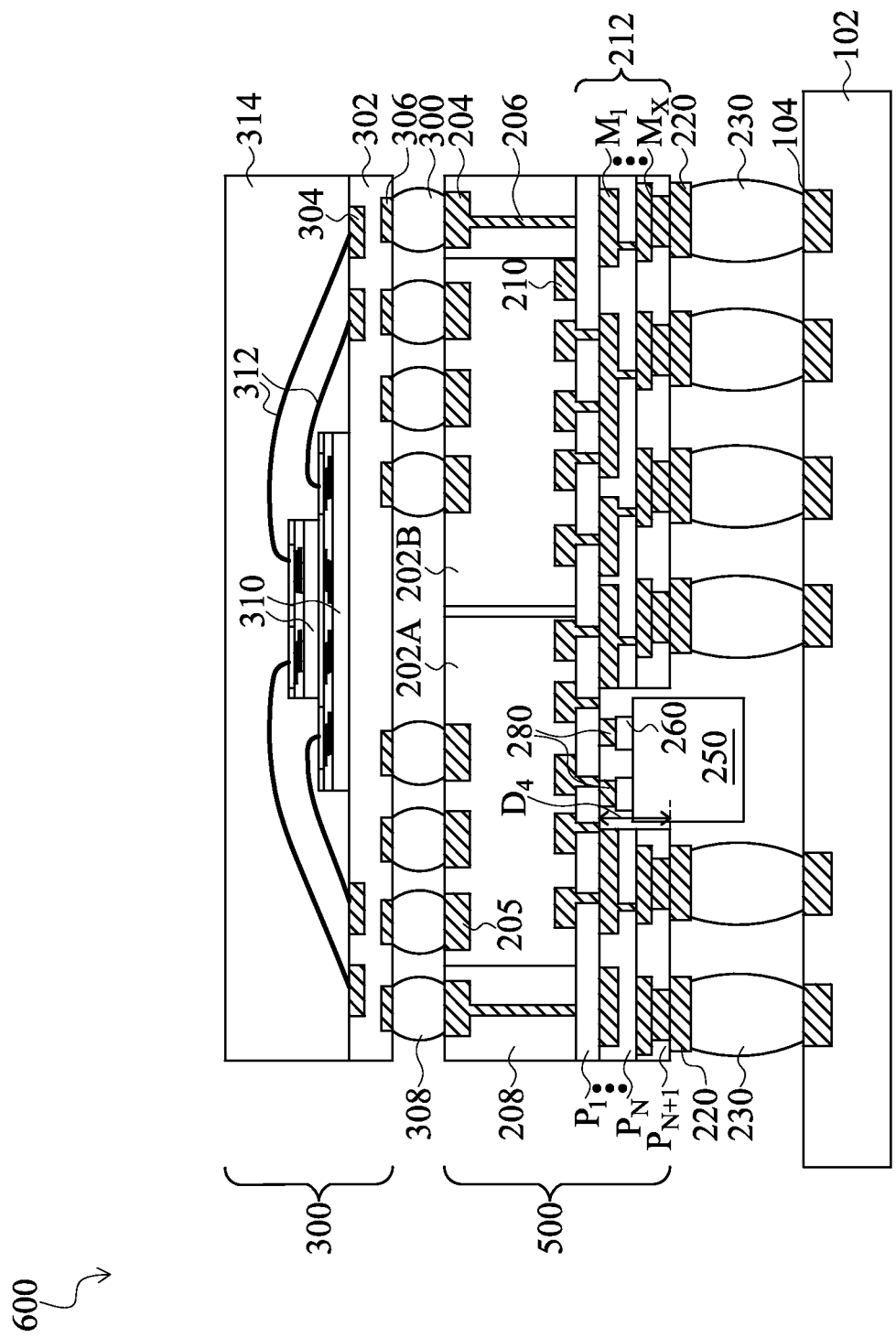
FIG. 2 illustrates a semiconductor package in accordance with some embodiments.

FIG. 2 illustrates a semiconductor package 600 in accordance with some embodiments. The semiconductor package 600 is similar to the semiconductor package 400 described above except that the semiconductor package 600 includes a first package 500 with the surface mount device 250 mounted directly to metal lines in the first metal layer $M_1$. Details regarding this embodiment that are similar to those for the previously described embodiment will not be repeated herein.

In this embodiment, the surface mount device 250 is mounted directly to one or more of the metal lines 280 of the first metal layer $M_1$ via conductive connectors 260. The portions of all of the passivation layers except $P_1$ (e.g. $P_N$ and $P_{N+1}$) which are covering the metal lines 280 may be removed by a suitable process, such as an etching process, a laser, the like, or a combination thereof. The recess formed by removing all of the passivation layers except $P_1$ (e.g. $P_N$ and $P_{N+1}$) which are covering the metal lines 280 has a depth of a distance $D_4$. In an embodiment, the distance $D_4$ is from about 15 μm to about 40 μm.

The surface mount device 250 may be placed on the interconnect structure 212 by, for example, a pick and place tool. In an embodiment, the surface mount device 250 is bonded to the interconnect structure 212 by a reflow process. During this reflow process, the metal lines 280 on the interconnect structure 212 are in contact with the conductive connectors 260 to physically and electrically couple the surface mount device 250 to the interconnect structure 212.

It should be noted that the surface mount device 250 can be mounted directly to any of the metal layers between $M_1$ and $M_X$ in the case that there are more than two metal layers in the interconnect structure 212.

By removing all of the passivation layers except the first passivation layer and mounting the surface mount device on the first metal layer, the process window for the surface mount device is enlarged. This could allow a larger surface mount device to fit between the package and the package substrate.

Figure 3:
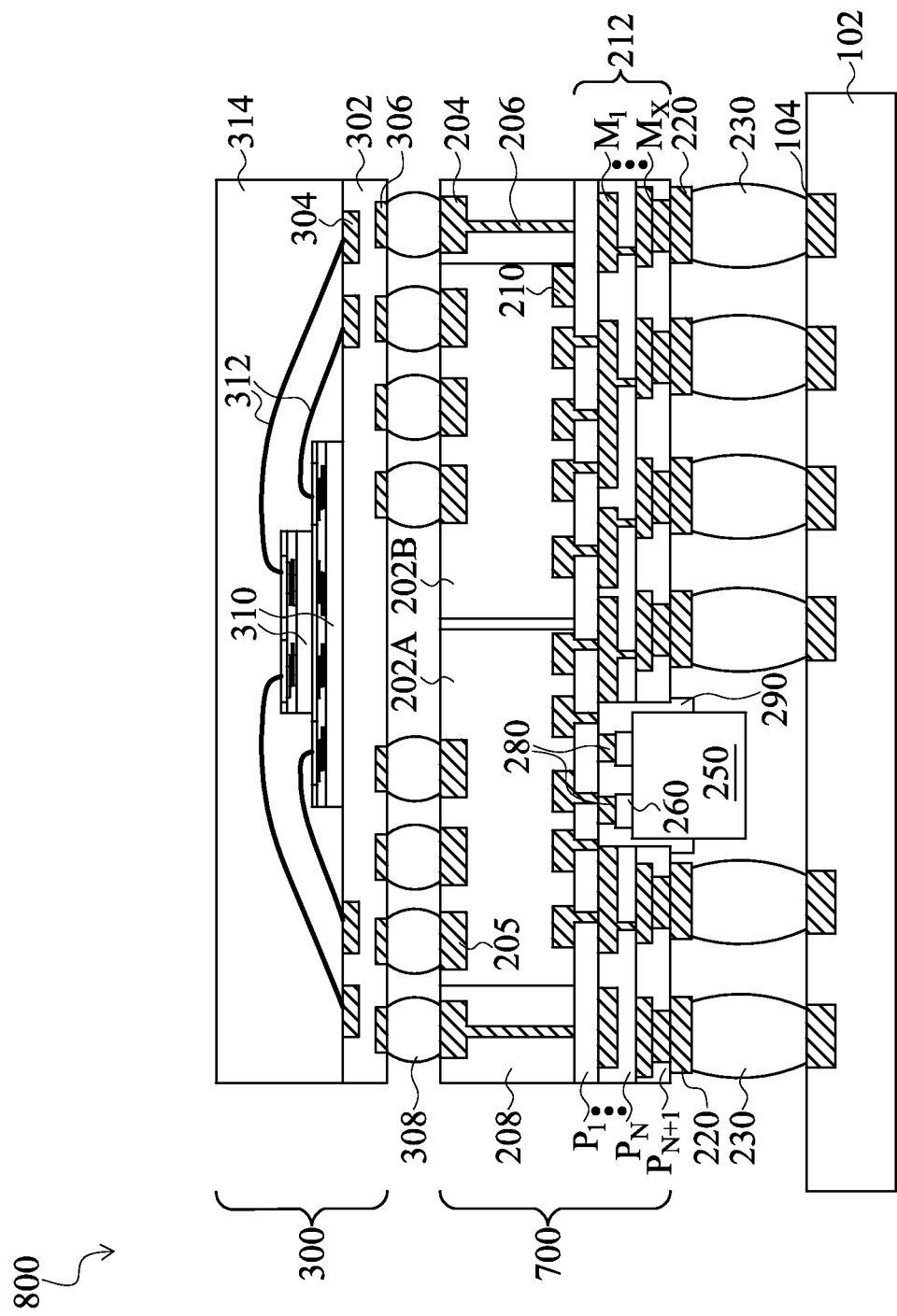
FIG. 3 illustrates a semiconductor package in accordance with some embodiments.

FIG. 3 illustrates a semiconductor package 800 in accordance with some embodiments. The semiconductor package 800 is similar to the semiconductor package 600 described above except that the semiconductor package 800 includes a first package 700 with the surface mount device 250 encapsulated with an encapsulant material 290. Details regarding this embodiment that are similar to those for the previously described embodiment will not be repeated herein.

In this embodiment, the surface mount device 250 is encapsulated with the encapsulant material 290. The encapsulant material 290 may be molded on the surface mount device 250, for example, using compression molding. In some embodiments, the encapsulant material 290 is a molding compound, a polymer, an epoxy, silicon oxide filler material, the like, or a combination thereof. A curing step may be performed to cure the molding material 314, wherein the curing may be a thermal curing, a UV curing, or the like. In some embodiments, the encapsulant material 290 extends past a surface of the top passivation layer $P_{N+1}$. In other embodiments, the encapsulant material 290 has a surface substantially coplanar with a surface of the top passivation layer $P_{N+1}$.

By encapsulating the surface mount device with an encapsulant material, the surface mount device is protected from moisture and the encapsulant material may provide some relief from thermal and physical stress. The encapsulant may improve the yield of semiconductor packages with the surface mount device.

An embodiment is a semiconductor package including a first package including one or more dies, and a package substrate bonded to a first side of the first package with by a first set of connectors. The semiconductor package further includes a surface mount device mounted to the first side of the first package, the surface mount device consisting essentially of one or more passive devices.

Another embodiment is a semiconductor package including a first package including a first die having a first side and a second side, the second side being opposite the first side, an interconnect structure over the first side of the first die, the interconnect structure comprising N number of metal layers and M number of passivation layers, a surface mount device being mounted to one of the N metal layers in a first portion of the interconnect structure, the first portion having less than M number of passivation layers, and a set of under bump metallizations (UBMs) coupled to the Nth metal layer of the interconnect structure of the first package, the Nth metal layer being the furthest metal layer from the first side of the first die. The semiconductor package further includes a first set of conductive connectors coupled to the set of UBMs, and a package substrate bonded to the first set of conductive connectors.

A further embodiment is a method including forming a first package including forming an interconnect structure over a first side of a first die, recessing a portion of the interconnect structure, and mounting a surface mount device in the recessed portion of the interconnect structure. The method further including bonding the interconnect structure of the first package to a package substrate using a first set of conductive connectors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
a first package comprising one or more dies;
a package substrate bonded to a first side of the first package by a first set of connectors;
a surface mount device mounted to the first side of the first package, the surface mount device consisting essentially of one or more passive devices; and
a second package bonded to a second side of the first package by a second set of conductive connectors, the second side being opposite the first side, the second package comprising one or more dies.

2. The semiconductor package of claim 1, wherein the first package further comprises an interconnect structure on the first side of the first package, the surface mount device being mounted in a recess in the interconnect structure.

3. The semiconductor package of claim 2, wherein the recess has a depth from about 10 μm to about 30 μm.

4. The semiconductor package of claim 2 further comprising an encapsulant in the recess and surrounding a portion of the surface mount device.

5. The semiconductor package of claim 1, wherein the surface mount device has two conductive connectors.

6. The semiconductor package of claim 1, wherein the first package further comprises:
an electrical connector extending from a second side of the first package to the first side of the first package, the second side being opposite the first side, the electrical connector being spaced from the one or more dies of the first package; and
a molding material surrounding the one or more dies of the first package and the electrical connector of the first package.

7. The semiconductor package of claim 1, wherein the one or more passive devices of the surface mount device are selected from a group consisting of a capacitor, a resistor, an inductor, or a combination thereof.

8. A semiconductor package comprising:
a first package comprising:
- a first die having a first side and a second side, the second side being opposite the first side;
- an interconnect structure over the first side of the first die, the interconnect structure comprising N number of metal layers and M number of passivation layers;
- a surface mount device being mounted to one of the N metal layers in a first portion of the interconnect structure, the first portion having less than M number of passivation layers; and
- a set of under bump metallizations (UBMs) coupled to the Nth metal layer of the interconnect structure of the first package, the Nth metal layer being the furthest metal layer from the first side of the first die;
a first set of conductive connectors coupled to the set of UBMs; and
a package substrate bonded to the first set of conductive connectors.

9. The semiconductor package of claim 8, wherein the surface mount device is mounted to the Nth metal layer of the interconnect structure.

10. The semiconductor package of claim 8, wherein the surface mount device is mounted to the first metal layer of the interconnect structure, the first metal layer being the nearest metal layer to the first side of the first die.

11. The semiconductor package of claim 8, wherein the first portion of the interconnect structure has M−1 passivation layers.

12. The semiconductor package of claim 8, wherein the first portion of the interconnect structure has one passivation layer.

13. The semiconductor package of claim 8, wherein a sidewall of the surface mount device is separated from a sidewall of the Mth passivation layer by at least 10 μm.

14. The semiconductor package of claim 8, wherein the surface mount device consists essentially of one or more passive devices.

15. The semiconductor package of claim 8 further comprising a second package comprising a second die, the second package being bonded to the second side of the first die by a second set of connectors.

16. A method comprising:
forming a first package comprising:
- forming an interconnect structure over a first side of a first die;
- recessing a portion of the interconnect structure, wherein recessing the portion of the interconnect structure further comprises removing at least one passivation layer from the portion of the interconnect structure; and
- mounting a surface mount device in the recessed portion of the interconnect structure; and
bonding the interconnect structure of the first package to a package substrate using a first set of conductive connectors.

17. The method of claim 16 further comprising encapsulating the surface mount device in the recessed portion of the interconnect structure.

18. The method of claim 16, wherein recessing the portion of the interconnect structure further comprises removing at least one metal layer from the portion of the interconnect structure.

19. The method of claim 16, wherein the forming the first package further comprises:
forming an electrical connector over a carrier substrate;
attaching the first die to the carrier substrate, the electrical connector extending from a second side of the first die to the first side of the first die, the second side being opposite the first side, the electrical connector being spaced from the first die;
encapsulating the first die and the electrical connector with a molding compound, the interconnect structure being formed over the first die and the molding compound, the interconnect structure being coupled to the first die and the electrical connector; and
removing the first package from the carrier substrate.

20. The method of claim 16 further comprising:
bonding a second package to first side of the first package using a second set of conductive connectors, the package substrate being bonded to a second side of the first package.

* * * * *